United States Patent [19]
Nasu

[11] Patent Number: 5,461,586
[45] Date of Patent: Oct. 24, 1995

[54] SELF-TIMED REDUNDANCY CIRCUIT

[75] Inventor: Takumi Nasu, Tsuchiura, Japan

[73] Assignee: Texas Instruments Incorporated, Dallas, Tex.

[21] Appl. No.: 189,224

[22] Filed: Jan. 31, 1994

[51] Int. Cl.[6] ................................................. G11C 11/40
[52] U.S. Cl. ........................................ 365/200; 365/230.01
[58] Field of Search ............................. 365/200, 230.01, 365/210, 189.05, 189.08, 96, 203; 307/441

[56] References Cited

U.S. PATENT DOCUMENTS

| | | | |
|---|---|---|---|
| 4,803,656 | 2/1989 | Takemae | 365/200 |
| 4,849,939 | 7/1989 | Muranaka et al. | 365/200 |
| 5,208,489 | 5/1993 | Houston | 307/451 |

*Primary Examiner*—David C. Nelms
*Assistant Examiner*—A. Zarabian
*Attorney, Agent, or Firm*—Robert N. Roundtree; Richard B. Havill; Richard L. Donaldson

[57] ABSTRACT

A circuit for replacing an array element with a redundant element in a semiconductor device is designed with a programmable circuit (128) storing an internal address and coupled to receive a buffered address (120 and 122). The programmable circuit (128) produces first (130) and second (132) redundant addresses in response to the internal and buffered addresses (120 and 122). A first decoder circuit (140), produces a signal to enable the redundant element (142) in response to the first redundant address (130). A second decoder circuit (148) produces a signal to enable the array element (150) in response to the second redundant address (132).

18 Claims, 4 Drawing Sheets

SELF-TIMED REDUNDANCY CIRCUIT

FIELD OF THE INVENTION

This invention relates to integrated circuits and more particularly to redundancy circuits.

BACKGROUND OF THE INVENTION

Present complementary metal oxide semiconductor (CMOS) dynamic random access memory (DRAM) circuits are frequently used for main memory in a variety of applications including desk top and portable computer systems. The extensive demand for dynamic random access memory circuits requires an optimal balance between minimum feature sizes and the inherent defect density of the process in order to maximize yield. The trend in dynamic random access memory design is to improve yield beyond that afforded by minimal defect density. This is accomplished by the addition of redundant elements that may be programmed to replace defective array elements and thereby improve yield.

Previous redundant circuits were unable to activate redundant elements and normal array elements with equal speed. This imposed a speed penalty on the entire dynamic random access memory, because its access time was characterized by the slowest element. In, U.S. Pat. No. 5,208,776, entitled PULSE GENERATION CIRCUIT, Nasu et al disclose a redundancy circuit in FIGS. 12–19 that is functionally similar to the circuit reproduced in FIG. 1 (prior art) for the purpose of illustration. Address buffers 16 and 18 are enabled by a clock signal CLK at terminal 14. They present a buffered address of N+1 bits to a programmable circuit 28, for example, in true and complementary form at terminals 20 and 24 and terminals 22 and 26 respectively. When the buffered address matches a stored internal address of the programmable circuit, the programmable circuit 28 produces a redundant address in which all bits are low on redundant address terminals 30–32. In response, NOR decoder 40 then produces a redundancy enable signal $REN_0$ for enabling a redundant element. If any redundancy enable signal is high, NOR gate 56 produces a low enable signal EN to disable a defective array element. If no redundancy enable signal is produced, enable signal EN at terminal 58 goes high in response to a delayed complement of clock signal CLK at terminal 54.

The speed penalty of the circuit of FIG. 1 may be observed from the waveforms of FIG. 2 (prior art). Parasitic resistance and capacitance of interconnect at terminal 14 and buffered address terminals 20–26 vary significantly due to the remote physical placement of address buffers 16 and 18. Thus, a significant delay is noted between time T1, when clock signal CLK enables the address buffers, and time T2, when the last of redundant addresses $RA_0$–$RA_N$ is valid. At time T3 redundancy enable signal $REN_0$ goes high after propagation delay through NOR decoder 40. Clock signal CLK must be inverted and delayed by element 48 until time T4 when all redundancy enable inputs at NOR gate 56 are valid to avoid false generation of an array element enable signal which would destroy data. This imposes a significant speed penalty, since a safe delay for element 48 under fast operating conditions may double under slow operating conditions where access time is specified. At time T5 a normal array element may be enabled. Thus, a significant speed penalty is noted from time T3 to time T5 for every normal array element access. Other circuit configurations may be used, but each contains a comparable speed penalty.

SUMMARY OF THE INVENTION

These problems are resolved by a circuit for replacing an array element with a redundant element in a semiconductor device. A programmable circuit storing an internal address receives a buffered address. The programmable circuit produces first and second redundant addresses in response to the internal and buffered addresses. A first decoder circuit produces a signal to enable the redundant element in response to the first redundant address. A second decoder circuit produces a signal to enable the array element in response to the second redundant address.

The present invention provides self-timed enable signals for redundant elements and array elements. The speed penalty of a conventional delay stage over temperature and voltage variations is eliminated by self-timing. The speed penalty inherent in previous methods of redundant matching is eliminated by parallel decoding of redundant and array elements.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
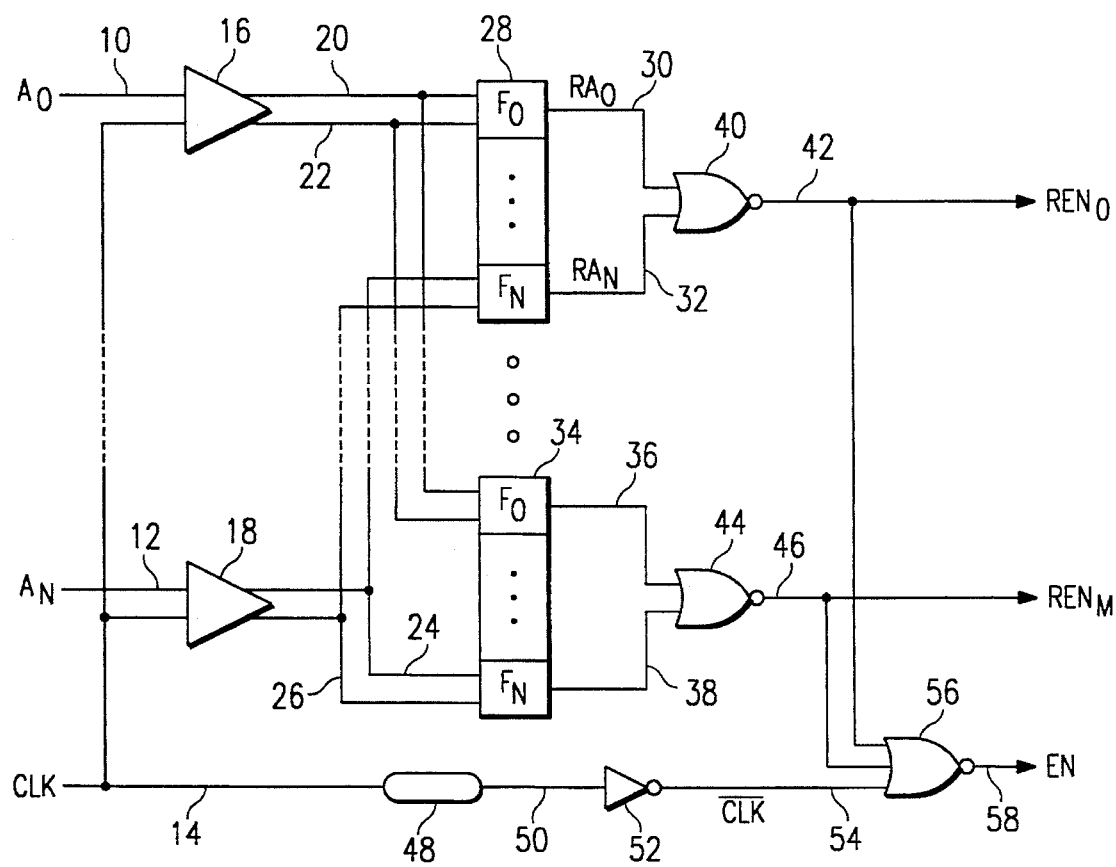
FIG. 1 is a diagram of a prior art redundant circuit.
Figure 2:
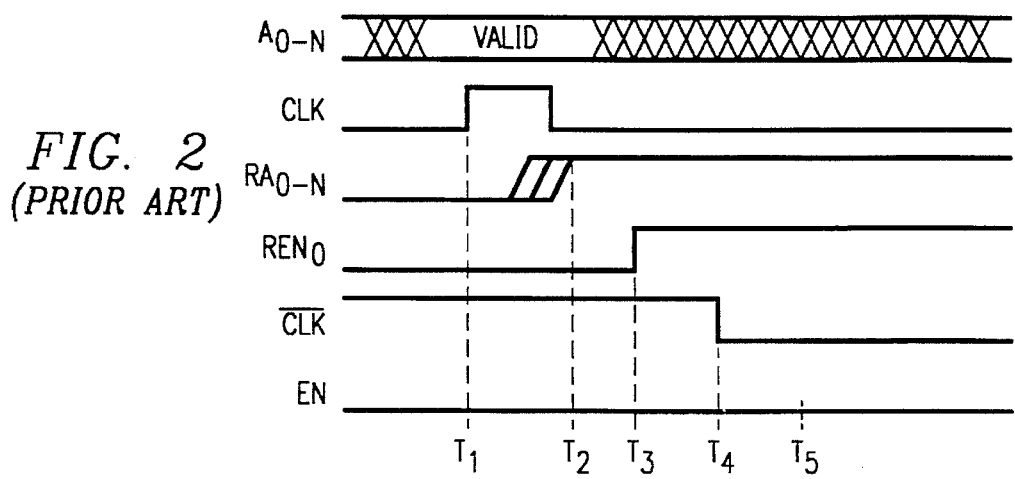
FIG. 2 is a timing diagram for the circuit of FIG. 1.
Figure 3:
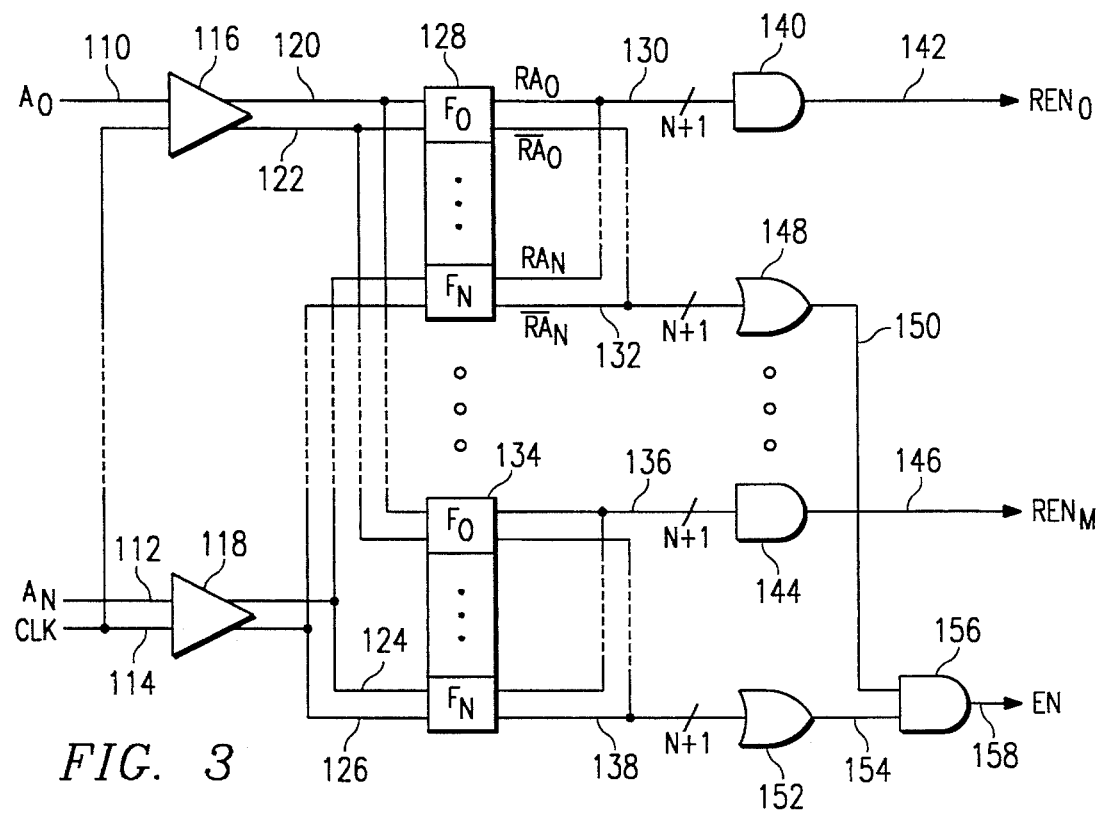
FIG. 3 is a diagram of an embodiment of the present invention.

Referring now to FIG. 3, the self-timed redundancy circuit will be described in detail. External addresses $A_0$ through $A_N$ are inputs to address buffers 116 through 118. Address buffers 116 through 118 are enabled by a clock signal CLK at terminal 114. They present a buffered address of N+1 bits to a programmable circuit 128, for example, in true and complementary form at terminals 120 and 124 and terminals 122 and 126 respectively. Programmable circuit 128 produces first and second redundant addresses $RA_0$–$RA_N$ and $\overline{RA_0}$–$\overline{RA_N}$ which are complementary with respect to each other in the preferred embodiment. Alternatively, only a single redundant address might be produced by programmable circuit 128 and its complement developed elsewhere.

When the buffered address matches a stored internal address of the programmable circuit, all bits of the first redundant address $RA_0$–$RA_N$ are high. In response, AND decoder 40 then produces redundancy enable signal $REN_0$ at terminal 142 for enabling a redundant element. Under the same circumstances, all complementary bits of the second redundant address are low. In response, the output of OR decoder 148 at terminal 150 is low, so enable signal EN at terminal 158 is low, thereby disabling a defective array element.

When the buffered address fails to match a stored internal address of any of the programmable circuits, at least one bit of each first redundant address, for example $RA_0$–$RA_N$, will be low for each AND decoder. Thus, every redundancy enable signal $REN_0$–$REN_M$ will be low, and no redundant element will be enabled. In a corresponding manner, at least one bit of each second redundant address, for example $\overline{RA_0}$–$\overline{RA_N}$, will be high for each OR decoder 148–152. Thus, each input on terminals 150–154 of AND gate 156 will be high producing a high enable signal EN to enable an array element.

Figure 4:
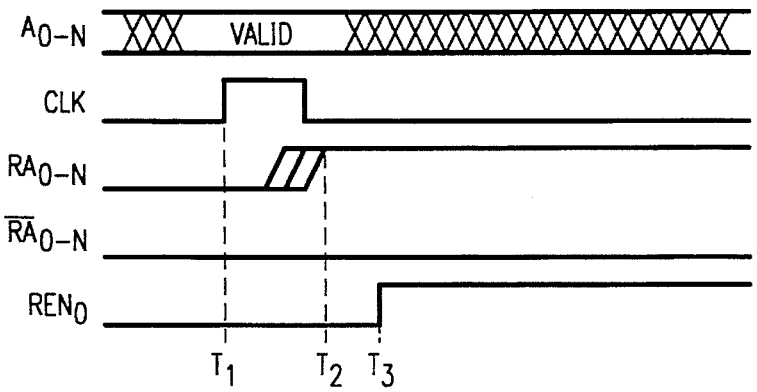
FIG. 4 is a timing diagram of the embodiment of FIG. 3 for a redundant element access.

Referring now to FIG. 4, the self-timed redundancy circuit will be described in detail for a redundant element access. External addresses $A_0$–$A_N$ are valid at address buffers 116-118 when clock enable signal CLK goes high at time T1. Parasitic resistance and capacitance of interconnect between the clock enable signal input and the address buffers and between the address buffers and the programmable circuits produce a delay until time T2 when the last bit of first redundant address $RA_0$–$RA_N$ goes high. In response, redundant enable signal $REN_0$ from AND decoder 140 goes high and enables a redundant element at time T3. Thus, use of the AND decoder is highly advantageous, since it produces a redundancy enable signal $REN_0$ responsive to the last valid bit of the first redundant address $RA_0$–$RA_N$ and is only limited by the address skew. All bits of second redundant address $\overline{RA_0}$–$\overline{RA_N}$ remain low, so enable signal EN remains low and a defective array element remains disabled.

Figure 5:
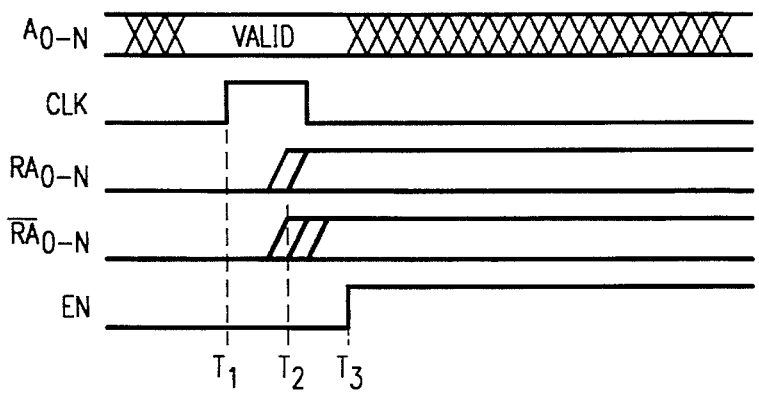
FIG. 5 is a timing diagram of the embodiment of FIG. 3 for an array element access.

Referring now to FIG. 5, the self-timed redundancy circuit will be described in detail for an array element access. External addresses $A_0$–$A_N$ are valid at address buffers 116118 when clock enable signal CLK goes high at time T1. Parasitic resistance and capacitance of interconnect between the clock enable signal input and the address buffers and between the address buffers and the programmable circuits produce a delay until time T2 when the first bit of second redundant address $\overline{RA_0}$–$\overline{RA_N}$ goes high. In response, the output of each OR decoder including 148 and 152 goes high, and AND gate 156 produces enable signal EN to enable an array element at time T3. Thus, use of the OR decoder is highly advantageous, since it produces a enable signal EN responsive to the first invalid bit of the second redundant address $\overline{RA_0}$–$\overline{RA_N}$ and is only limited by the address skew. There is no speed penalty due to delay element variations over temperature and voltage. Furthermore, there is no speed penalty for a timing margin to guard against false activation of an array element. At least one bit of the first redundant address $RA_0$–$RA_N$ will remain low, so no redundancy enable signal is produced.

Figure 6:
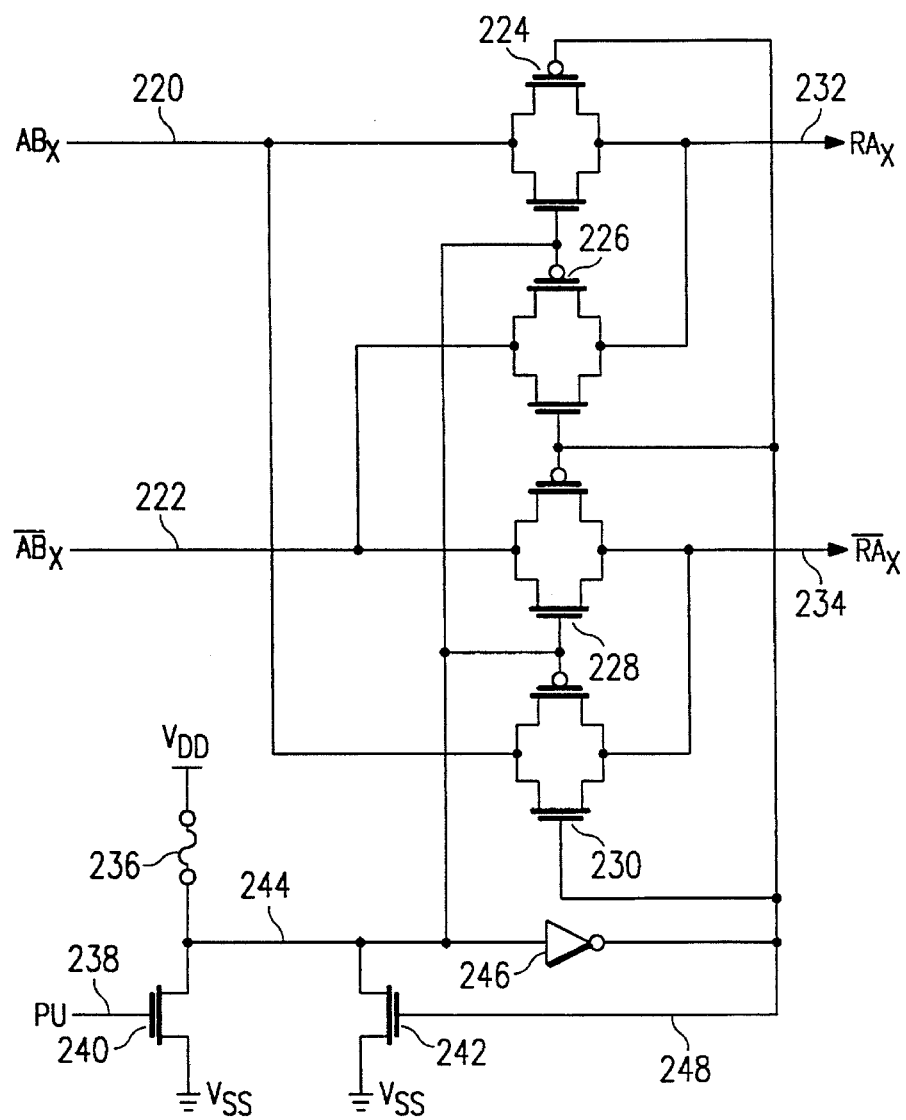
FIG. 6 is a fuse circuit which may be used in the programmable circuit in FIG. 3.

Referring now to FIG. 6, a fuse circuit which may be used in the programmable circuit of FIG. 3 will be described in detail. Fuse 236 is typically a polysilicon or metal fuse link that may be blown by a LASER or other means. Alternatively, any other nonvolatile storage means such as an EPROM or ROM cell may be substituted for fuse 236. Fuse 236 is connected between a voltage supply and terminal 244. During power up, a short positive pulse is produced by a circuit as disclosed in FIG. 123 of U.S. Pat. No. 5,208,776, to set the latch formed by inverter 246 and transistor 242. If fuse 236 is not blown, terminal 244 remains high and the output of inverter 246 remains low. Thus, pass gate 224 conducts a true bit of the buffered address to a bit of the first redundant address, and pass gate 228 conducts a complementary bit of the buffered address to a bit of the second redundant address. Pass gates 226 and 230 remain in a high impedance state.

If fuse 236 is blown, terminal 244 is driven low by transistor 240 in response to power up signal PU. The output of inverter 246 goes high, and transistor 242 turns on to latch terminal 244 low. Thus, pass gate 230 conducts a true bit of the buffered address to a bit of the second redundant address, and pass gate 226 conducts a complementary bit of the buffered address to a bit of the first redundant address. Pass gates 224 and 228 remain in a high impedance state.

Figure 7:
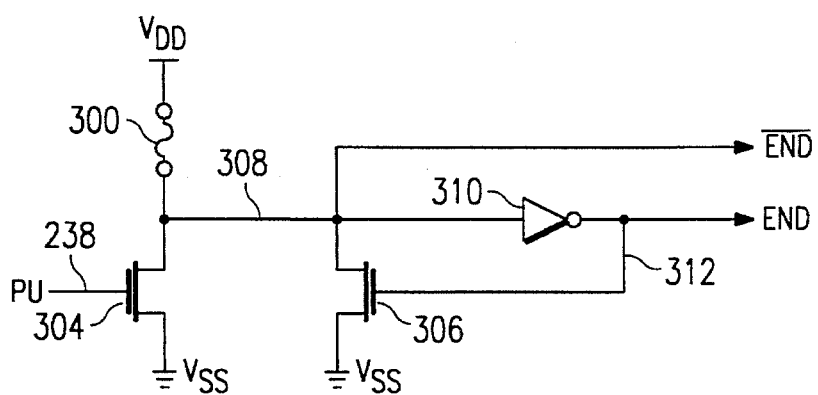
FIG. 7 is an enable fuse circuit which may be used in the programmable circuit in FIG. 3.

Referring now to FIG. 7, an enable fuse circuit which may be used in the programmable circuit of FIG. 3 will be described in detail. Fuse 300 is typically a polysilicon or metal fuse link that may be blown by a LASER or other means. Alternatively, any other nonvolatile storage means such as an EPROM or ROM cell may be substituted for fuse 300. Fuse 300 is connected between a voltage supply and terminal 308. During power up, a short positive pulse is produced by a circuit as disclosed in FIG. 123 of U.S. Pat. No. 5,208,776, to set the latch formed by inverter 310 and transistor 306. If fuse 300 is not blown, terminal 308 remains high and the output of inverter 310 remains low. Thus, decoder enable signal END is low and its complement $\overline{END}$ is high. Alternatively, if fuse 300 is blown, decoder enable signal END is latched high and its complement $\overline{END}$ is low.

Figure 8:
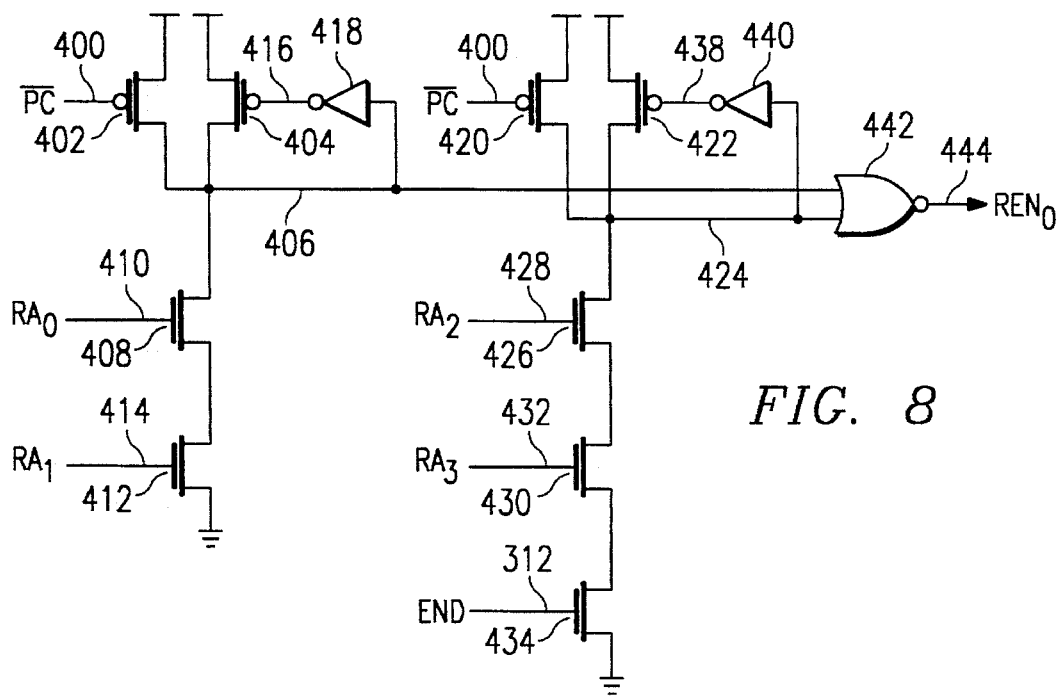
FIG. 8 is an AND decoder circuit which may be used in the programmable circuit in FIG. 3.

Referring now to FIG. 8, an AND decoder which may be used in FIG. 3 will be described in detail. The AND decoder is formed by two precharge-discharge NAND gates having their outputs coupled to the inputs of a NOR gate 442. The first precharge-discharge NAND gate has an output at terminal 406 which is precharged high by transistor 402 responsive to precharge signal $\overline{PC}$. The latch formed by transistor 404 and inverter 418 keep terminal 406 high after precharge is complete when transistor 402 is off or if either of transistors 408 or 412 is off. If bits $RA_0$ and $RA_1$ of the first redundant address are high, transistors 408 and 412 turn on, overpower transistor 404, and drive terminal 406 low, thereby resetting the latch.

The second precharge-discharge NAND gate has an output at terminal 424 and functions in the same manner as the first precharge-discharge NAND gate except that transistor 434 is also in the discharge path of this embodiment of the invention. Thus, when decoder enable signal END of FIG. 7 remains low, terminal 424 cannot be discharged. Redundancy enable signal $REN_0$ remains low, since at least one input of NOR gate 442 remains high.

Figure 9:
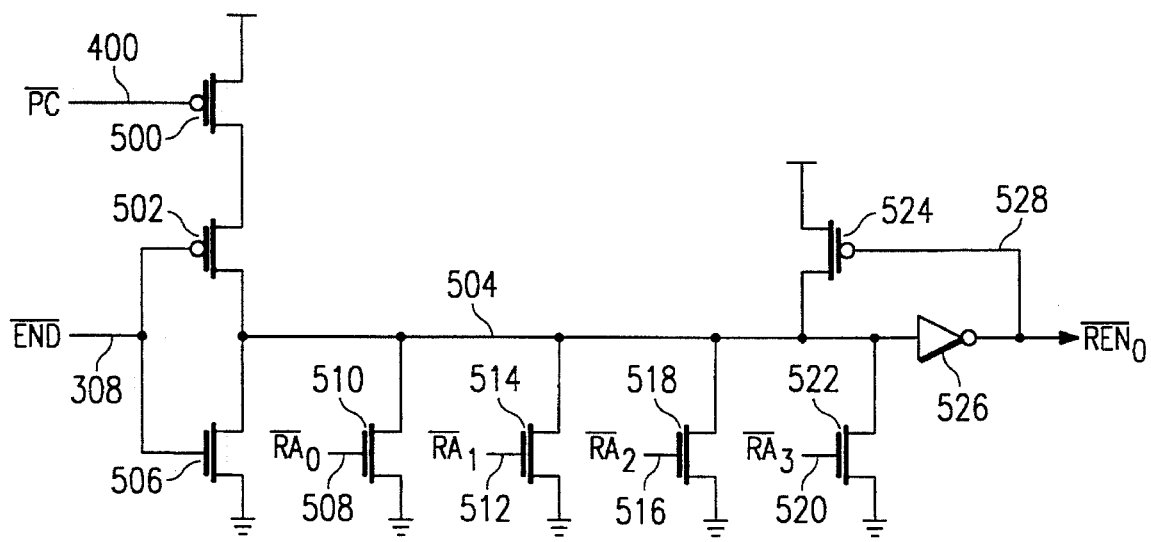
FIG. 9 is an OR decoder circuit which may be used in the programmable circuit in FIG. 3.

Referring now to FIG. 9, an OR decoder which may be used in FIG. 3 will be described in detail. The OR decoder is formed by a precharge-discharge NOR decoder with an output at terminal 504 coupled to the input of inverter 526. The output at terminal 504 is precharged high through transistors 500 and 502 when complementary decoder enable signal $\overline{END}$ and precharge signal $\overline{PC}$ are low. The latch formed by transistor 524 and inverter 526 keep terminal 504 high after precharge is complete when transistor 500 is off. If bits $\overline{RA_0}$–$\overline{RA_3}$ of the second redundant address are low, transistors 510, 514, 518, or 522 remain off, terminal 504 remains high, and OR decoder output $\overline{REN_0}$ remains low, thereby disabling a defective array element. If at least one bit of the second redundant address is high, terminal 504 is discharged and OR decoder output $\overline{REN_0}$ goes high.

When complementary decoder enable signal $\overline{END}$ is high, terminal 504 always remains low and the OR decoder is disabled. If no OR decoder 148–152 (FIG. 3) is enabled on a semiconductor device where no repairs are required, all OR decoder outputs are high and enable signal EN is always high. Thus, array elements are perpetually enabled on semiconductor devices where repairs are not required. This offers an additional speed advantage since array elements are enabled without the propagation delay of the buffered addresses through the redundancy circuit.

Although the invention has been described in detail with reference to its preferred embodiment, it is to be understood that this description is by way of example only and is not to be construed in a limiting sense. It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit for replacing an array element with a redundant element in a semiconductor device, the circuit comprising:

a programmable circuit storing an internal address and coupled to receive a buffered address, for producing first and second redundant addresses in response to the internal and buffered addresses wherein the second redundant address is a complement of the first redundant address;

a first decoder circuit, responsive to the first redundant address, for producing a signal to enable the redundant element; and a second decoder circuit, responsive to the second redundant address, for producing a signal to enable the array element.

2. The circuit of claim 1, wherein the programmable circuit comprises a plurality of fuse circuits.

3. The circuit of claim 2, wherein the programmable circuit further comprises an enable fuse circuit.

4. The circuit of claim 1, wherein the first decoder circuit comprises a precharge-discharge NAND gate.

5. The circuit of claim 1, wherein the second decoder circuit comprises a precharge-discharge NOR gate.

6. A circuit for replacing an array element with a redundant element in a semiconductor device, the circuit comprising:

a programmable circuit storing an internal address comprising a first plurality of bits and coupled to receive a buffered address comprising a second plurality of bits, for producing first and second redundant addresses;

a first decoder circuit, responsive to matching internal and buffered addresses, for producing a signal to enable the redundant element; and a second decoder circuit, responsive to a first address bit of the first plurality of bits that does not match a bit of the second plurality of bits, for producing a signal to enable the array element.

7. The circuit of claim 6, wherein the programmable circuit comprises a plurality of nonvolatile circuits.

8. The circuit of claim 7, wherein the nonvolatile circuits are fuse circuits.

9. The circuit of claim 6, wherein the second redundant address is a complement of the first redundant address.

10. The circuit of claim 6, wherein the first decoder circuit comprises a precharge-discharge NAND gate.

11. The circuit of claim 6, wherein the second decoder circuit comprises a precharge-discharge NOR gate.

12. The circuit of claim 6, wherein the matching internal and buffered addresses are complementary.

13. A method of replacing an array element with a redundant element in a semiconductor device, the method comprising the steps of:

storing an internal address comprising a first plurality of bits in a programmable circuit;

applying a buffered address comprising a second plurality of bits to the programmable circuit;

comparing the internal address to the buffered address;

producing a signal for enabling the redundant element in response to matching internal and buffered addresses; and producing a signal for enabling the array element in response to a first bit of the first plurality of bits that does not match a bit of the second plurality of bits.

14. A method as in claim 13, further comprising the steps of:

enabling the redundant element in response to the signal for enabling the redundant element; and disabling the array element.

15. A method as in claim 13, further comprising the steps of:

enabling the array element in response to the signal for enabling the array element; and disabling the redundant element.

16. A method of operating a self-timed redundant circuit in a semiconductor device, the method comprising the steps of:

storing a first address comprising a plurality of bits in a programmable circuit;

applying a second address comprising a plurality of bits to the programmable circuit;

comparing the first address to the second address;

producing a first self-timed signal for enabling a normal element in response to a first bit of the first address that does not match a corresponding bit of the second address; and producing a second self-timed signal for enabling a redundant element in response to matching first and second addresses.

17. A method as in claim 16, further comprising the steps of:

enabling the normal element in response to the first signal; and disabling the redundant element.

18. A method as in claim 16, further comprising the steps of:

enabling the redundant element in response to the second signal; and disabling the normal element.

* * * * *

(12) EX PARTE REEXAMINATION CERTIFICATE (4908th)
United States Patent
Nasu

(10) Number: US 5,461,586 C1
(45) Certificate Issued: Feb. 17, 2004

(54) SELF-TIMED REDUNDANCY CIRCUIT

(75) Inventor: Takumi Nasu, Tsuchiura (JP)

(73) Assignee: Texas Instruments Incorporated, Dallas, TX (US)

Reexamination Request:
No. 90/005,997, May 7, 2001

Reexamination Certificate for:
Patent No.: 5,461,586
Issued: Oct. 24, 1995
Appl. No.: 08/189,224
Filed: Jan. 31, 1994

(51) Int. Cl.$^7$ .............. G11C 7/00; G11C 8/00
(52) U.S. Cl. ............ 365/200; 365/189.07; 365/230.06; 365/230.08; 365/230.01
(58) Field of Search .................. 365/200, 189.07, 365/189.05, 230.06, 230.08

(56) References Cited

U.S. PATENT DOCUMENTS 5,602,771 A    2/1997   Kajigaya et al.

*Primary Examiner*—Son T. Dinh

(57) ABSTRACT

A circuit for replacing an array element with a redundant element in a semiconductor device is designed with a programmable circuit (128) storing an internal address and coupled to receive a buffered address (120 and 122). The programmable circuit (128) produces first (130) and second (132) redundant addresses in response to the internal and buffered addresses (120 and 122). A first decoder circuit (140), produces a signal to enable the redundant element (142) in response to the first redudant address (130). A second decoder circuit (148) produces a signal to enable the array element (150) in response to the second redundant address (132).

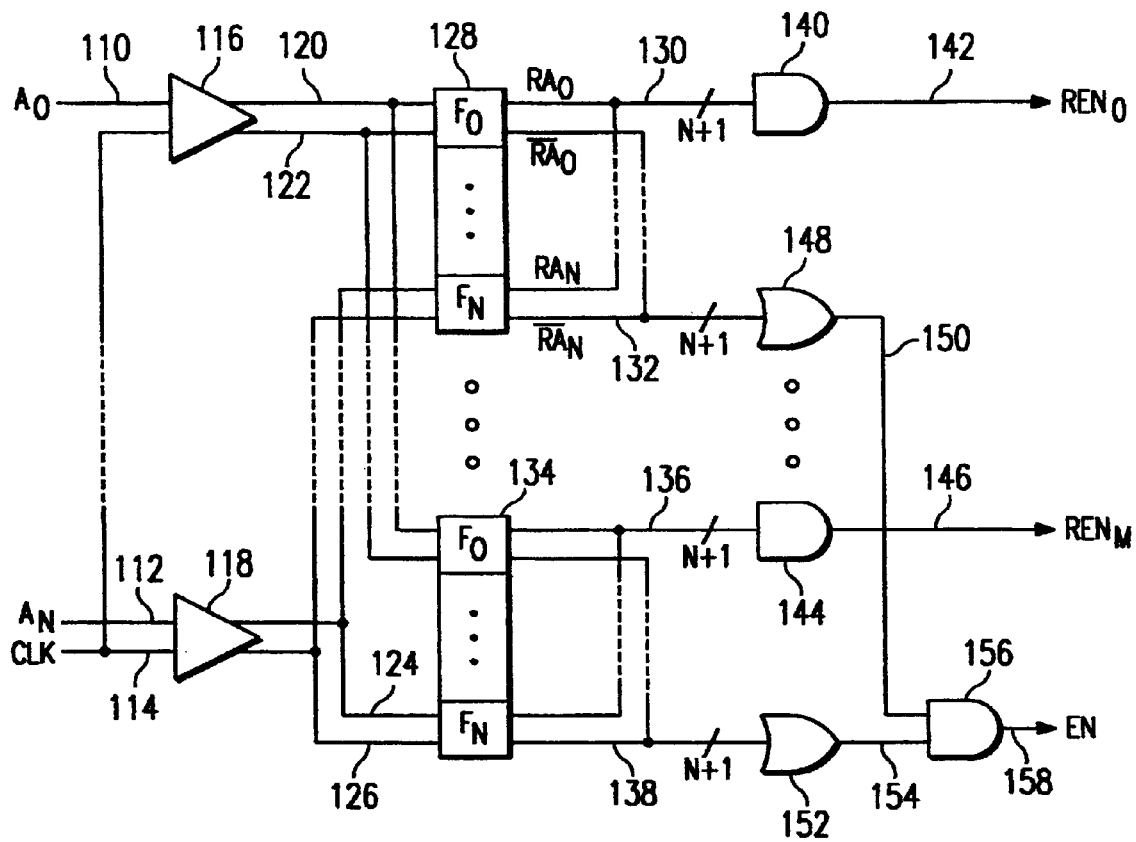

US 5,461,586 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 6, 13 and 16 are determined to be patentable as amended.

Claims 2–5, 7–12, 14–15 and 17–18, dependent on an amended claim, are determined to be patentable.

New claims 19–33 are added and determined to be patentable.

1. A circuit for replacing an array element with a redundant element in a semiconductor device, the circuit comprising:
    a programmable circuit storing an internal address and coupled to receive a buffered address, for producing first and second redundant addresses in response to the internal and buffered addresses wherein the second redundant address is a complement of the first redundant address;
    a first decoder circuit, responsive to the first redundant address, for producing a signal to enable the redundant element; and
    a second decoder circuit, responsive *only* to the second redundant address, for producing a signal to enable the array element.

6. A circuit for replacing an array element with a redundant element in a semiconductor device, the circuit comprising:
    a programmable circuit storing an internal address comprising a first plurality of bits and coupled to receive a buffered address comprising a second plurality of bits, for producing first and second redundant addresses;
    a first decoder circuit, responsive to matching internal and buffered addresses, for producing a signal to enable the redundant element; and
    a second decoder circuit, responsive to a first address bit of the first plurality of bits that does not match a *corresponding* bit of the second plurality of bits *and only responsive to one of the first and second redundant addresses*, for producing a signal to enable the array element.

13. A method of replacing an array element with a redundant element in a semiconductor device, the method comprising the steps of:
    storing an internal address comprising a first plurality of bits in a programmable circuit;
    applying a buffered address comprising a second plurality of bits to the programmable circuit;
    comparing the internal address to the buffered address;
    producing a signal for enabling the redundant element in response to matching internal and buffered addresses; and
    producing a signal for enabling the array element *only* in response to *the step of comparing* a first bit of the first plurality of bits that does not match a *corresponding* bit of the second plurality of bits.

16. A method of operating a self-timed redundant circuit in a semiconductor device, the method comprising the steps of:
    storing a first address comprising a plurality of bits in a programmable circuit;
    applying a second address comprising a plurality of bits to the programmable circuit;
    comparing the first address to the second address;
    producing a first self-timed signal for enabling a normal element *only* in response to *the step of comparing* a first bit of the first address that does not match a corresponding bit of the second address; and
    producing a second self-timed signal for enabling a redundant element in response to matching first and second addresses.

*19. A circuit for replacing an array element with a redundant element in a semiconductor device, the circuit comprising:*
    *a programmable circuit storing an internal address and coupled to receive a buffered address, for producing first and second redundant addresses in response to the internal and buffered addresses wherein the second redundant address is a complement of the first redundant address;*
    *a first decoder circuit, responsive to the first redundant address, for producing a signal to enable the redundant element; and*
    *a second decoder circuit, responsive to the second redundant address, for producing a signal to enable the array element at a time determined by the second redundant address.*

*20. The circuit of claim 19, wherein the programmable circuit comprises a plurality of fuse circuits.*

*21. The circuit of claim 20, wherein the programmable circuit further comprises an enable fuse circuit.*

*22. The circuit of claim 19, wherein the first decoder circuit comprises a precharge-discharge NAND gate.*

*23. The circuit of claim 19, wherein the second decoder circuit comprises a precharge-discharge NOR gate.*

*24. A circuit for replacing an array element with a redundant element in a semiconductor device, the circuit comprising:*
    *a programmable circuit storing an internal address comprising a first plurality of bits and coupled to receive a buffered address comprising a second plurality of bits, for producing first and second redundant addresses;*
    *a first decoder circuit, responsive to matching internal and buffered addresses, for producing a signal to enable the redundant element; and*
    *a second decoder circuit, responsive to a first address bit of the first plurality of bits that does not match a corresponding bit of the second plurality of bits, for producing a signal to enable the array element at a time determined by the first address bit not matching the corresponding bit.*

*25. The circuit of claim 24, wherein the programmable circuit comprises a plurality of nonvolatile circuits.*

*26. The circuit of claim 25, wherein the nonvolatile circuits are fuse circuits.*

*27. The circuit of claim 24, wherein the second redundant address is a complement of the first redundant address.*

28. The circuit of claim 24, wherein the first decoder circuit comprises a precharge-discharge NAND gate.

29. The circuit of claim 24, wherein the second decoder circuit comprises a precharge-discharge NOR gate.

30. The circuit of claim 24, wherein the matching internal and buffered addresses are complementary.

31. A method of replacing an array element with a redundant element in a semiconductor device, the method comprising the steps of:

storing an internal address comprising a first plurality of bits in a programmable circuit;

applying a buffered address comprising a second plurality of bits to the programmable circuit;

comparing the internal address to the buffered address;

producing a signal for enabling the redundant element in response to matching internal and buffered addresses; and producing a signal for enabling the array element in response to the step of comparing a first bit of the first plurality of bits that does not match a corresponding bit of the second plurality of bits at a time determined by the step of comparing the first bit.

32. A method as in claim 31, further comprising the steps of:

enabling the redundant element in response to the signal for enabling the redundant element; and disabling the array element.

33. A method as in claim 31, further comprising the steps of:

enabling the array element in response to the signal for enabling the array element; and disabling the redundant element.

* * * * *